United States Patent
Lee (10) Patent No.: US 7,408,483 B2
(45) Date of Patent: Aug. 5, 2008

(54) APPARATUS AND METHOD OF GENERATING DBI SIGNAL IN SEMICONDUCTOR MEMORY APPARATUS

(75) Inventor: Dong-Uk Lee, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/600,768

(22) Filed: Nov. 17, 2006

(65) Prior Publication Data

US 2007/0121360 A1    May 31, 2007

(30) Foreign Application Priority Data

Nov. 29, 2005    (KR) ............... 10-2005-0115074

(51) Int. Cl.
*H03M 5/00* (2006.01)

(52) U.S. Cl. .............. 341/55; 341/56; 365/189.02; 365/189.05; 365/189.07

(58) Field of Classification Search ......... 341/55; 365/189.07
See application file for complete search history.

(56) References Cited

U.S. PATENT DOCUMENTS

| | | | |
|---|---|---|---|
| 5,777,935 A | 7/1998 | Pantelakis et al. | |
| 5,936,885 A | 8/1999 | Morita et al. | |
| 6,046,943 A * | 4/2000 | Walker | 365/189.05 |
| 6,288,928 B1 | 9/2001 | Shinozaki | |
| 6,400,633 B1 * | 6/2002 | Al-Shamma et al. | 365/227 |
| 6,584,526 B1 | 6/2003 | Bogin et al. | |
| 6,611,473 B2 * | 8/2003 | Al-Shamma et al. | 365/227 |
| 6,898,648 B2 | 5/2005 | LaBerge | |
| 6,992,506 B2 * | 1/2006 | Park et al. | 326/52 |
| 6,999,352 B2 * | 2/2006 | Yoshida et al. | 365/189.05 |
| 7,082,489 B2 * | 7/2006 | Yeh et al. | 710/305 |
| 7,142,021 B2 * | 11/2006 | Park | 326/104 |
| 7,228,370 B2 * | 6/2007 | Kwack et al. | 710/52 |
| 2004/0065904 A1 | 4/2004 | Yoshida et al. | |
| 2005/0005054 A1 | 1/2005 | Jang | |
| 2007/0008008 A1 * | 1/2007 | Kwack et al. | 326/87 |
| 2007/0038789 A1 * | 2/2007 | Macri et al. | 710/105 |

FOREIGN PATENT DOCUMENTS

| | | |
|---|---|---|
| JP | 11306799 | 11/1999 |
| JP | 2005025765 | 1/2005 |
| JP | 2005032417 | 2/2005 |
| JP | 2005190585 | 7/2005 |
| KR | 1020030002508 | 1/2003 |

* cited by examiner

*Primary Examiner*—Khai M Nguyen
(74) *Attorney, Agent, or Firm*—Venable LLP; Jeffri A. Kamimski (57) ABSTRACT

An apparatus for generating a DBI signal in a semiconductor memory apparatus includes a data switching detection unit that detects whether or not previous data is consistent with current data and outputs a detection signal according to a detection result, and a DBI detection unit that outputs a DBI signal according to a difference in charge sharing level using the detection signal. Therefore, it is possible to minimize current consumption. Further, since there is no effect due to resistance skew of a transistor, an error in DBI signal generation and an error in data transfer accordingly can be prevented. Therefore, it is possible to improve the reliability of a system to which a semiconductor memory apparatus is applied.

48 Claims, 6 Drawing Sheets

FIG. 1

(PRIOR ART)

APPARATUS AND METHOD OF GENERATING DBI SIGNAL IN SEMICONDUCTOR MEMORY APPARATUS

BACKGROUND

1. Technical Field

The present invention relates to a semiconductor memory apparatus, and more particularly, to an apparatus and a method of generating a DBI signal in a semiconductor memory apparatus.

2. Related Art

A DBI (Data Bus Inversion) system is used in order to prevent a problem, such as simultaneous switching noise or inter symbol interference, that occurs as the number of data bits to be switched increases upon data transmission, that is, as the number of currently switched data bits among the entire data bits becomes larger than the number of previously switched data bits.

In the DBI system, in order to solve the above problem, when the number of switched data bits is half or more of the number of all data bits, a DBI signal (DBI Flag) is enabled, and inverted data is transmitted, instead of original data, thereby reducing the number of switched data bits to half or less.

Hereinafter, the related art will be described with reference to FIG. 1.

Figure 1:
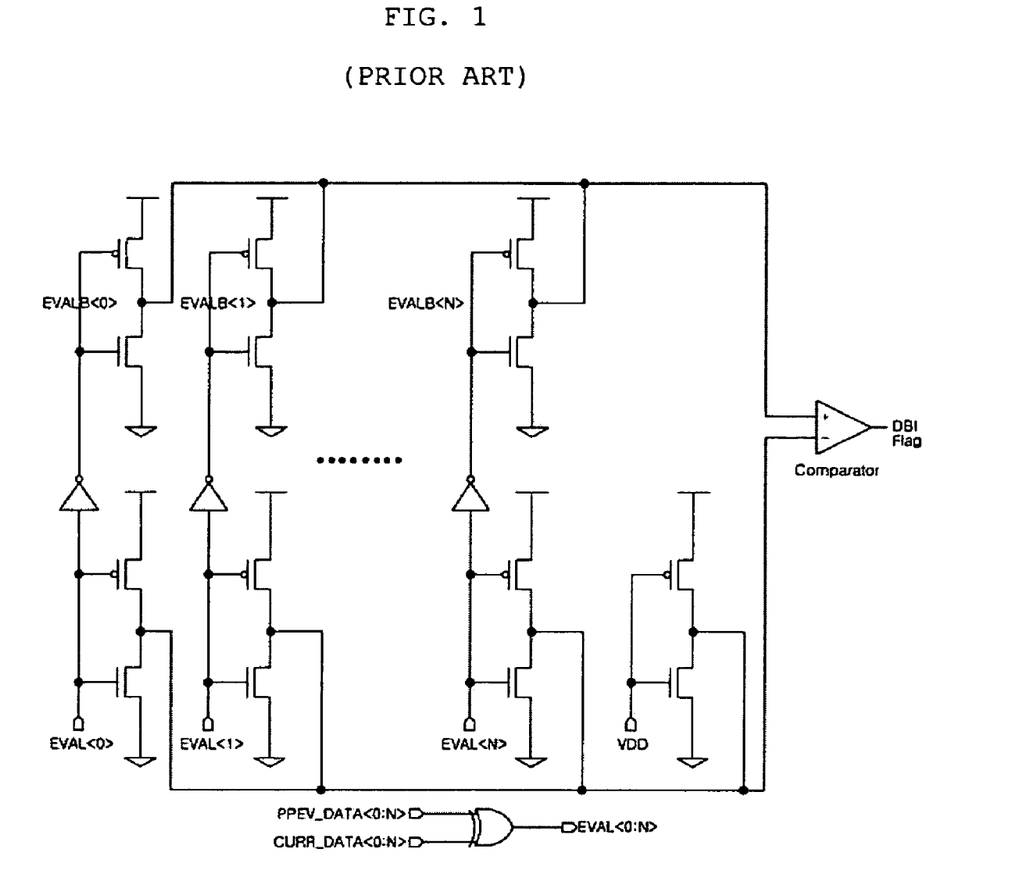
FIG. 1 is a circuit diagram showing the configuration of an apparatus for generating a DBI signal in a semiconductor memory apparatus according to the related art.

As shown in FIG. 1, an apparatus for generating a OBI signal in a semiconductor memory apparatus according to the related art compares previous data PREV_DATA and current data CURR_DATA, each of which has N+1 bits from 0 to N, using an XOR gate.

When a previous data bit is different from a current data bit, a signal corresponding to the changed bit among signals EVAL<0:N> is enabled and inverted signals EVALB<0:N> of the signals EVAL<0:N> are generated.

At this time, when the previous data bit is consistent with the current data bit, a signal corresponding to the unchanged bit among signals EVALB<0:N> is enabled.

The signals EVAL<0:N> and the inverted signals EVALB<0:N> are correspondingly input to inverter arrays whose output terminals are connected to the same node. The outputs of the individual inverter arrays are input to a negative input terminal (−) and a positive input terminal (+) of a comparator.

At this time, the number of P-type transistors and N-type transistors to be turned on in the inverters varies according to the number of enabled signals among the signals EVAL<0:N> and the inverted signals EVALB<0:N>.

Accordingly, a voltage difference occurs between the negative input terminal (−) and the positive input terminal (+) of the comparator according to a resistance ratio between the P-type transistor and the N-type transistor. The comparator outputs a DBI signal at high level or low level according to the voltage difference.

For example, when N=7 and the number of enabled signals among the signals EVAL<0:N> is four or more, the voltage at the negative input terminal of the comparator becomes lower than the voltage at the positive input terminal thereof, and the DBI signal is enabled (for example, a high level). Otherwise, the DBI signal is disabled, that is, the DBI signal changes to a low level.

However, the apparatus for generating a DBI signal in a semiconductor memory apparatus according to the related art has the following problems.

First, since the outputs of the inverters are connected to the same node, a short circuit current may be generated, thereby increasing current consumption.

Second, there may be an error in DBI signal generation due to resistance skew of a transistor of each inverter, which causes an error in data transfer. As a result, an operation error in a system to which a semiconductor memory apparatus is applied may occur.

SUMMARY

Embodiments of the present invention provide an apparatus and a method of generating a DBI signal in a semiconductor memory apparatus that can minimize current consumption and prevent an error in the DBI signal.

In an embodiment of the present invention, an apparatus for generating a DBI signal in a semiconductor memory apparatus includes a data switching detection unit that detects whether or not previous data is consistent with current data and outputs a detection signal according to the detection result, and a DBI detection unit that outputs a DBI signal according to a difference in charge sharing level using the detection signal.

According to another embodiment of the present invention, a method of generating a DBI signal in a semiconductor memory apparatus includes charging first and second capacitive elements to the same level according to a control signal, comparing previous data and current data and generating a detection signal according to the comparison result, discharging the first and second capacitive elements according to the detection signal, and generating a DBI signal according to a level difference between the first and second capacitive elements.

DESCRIPTION OF EXEMPLARY EMBODIMENTS

Hereinafter, an apparatus and a method of generating a DBI signal in a semiconductor memory apparatus according to an exemplary embodiment of the present invention will be described in detail with reference to the accompanying drawings.

Even though the exemplary embodiment of the present invention described below can be applied regardless of the number of data bits, for convenience of explanation, hereinafter 8-bit data will be exemplified.

Figure 2:
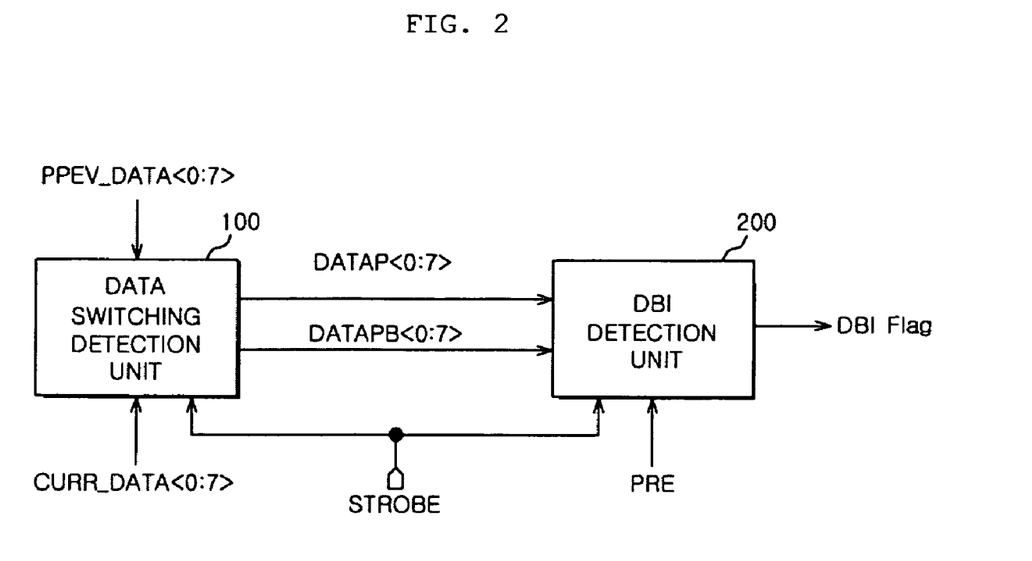
FIG. 2 is a block diagram showing the structure of an apparatus for generating a DBI signal in a semiconductor memory apparatus according to an exemplary embodiment of the present invention.

As shown in FIG. 2, the apparatus for generating a DBI signal in a semiconductor memory apparatus according to the exemplary embodiment of the present invention includes a data switching detection unit 100 that detects whether or not previous data PREV_DATA<0:7> is consistent with current data CURR_DATA<0:7> and outputs detection signals DATAP<0:7> and DATAPB<0:7> according to the detection result, and a DBI detection unit 200 that outputs a DBI signal (DBI Flag) according to a difference in charge sharing level using the detection signals.

Figure 3:
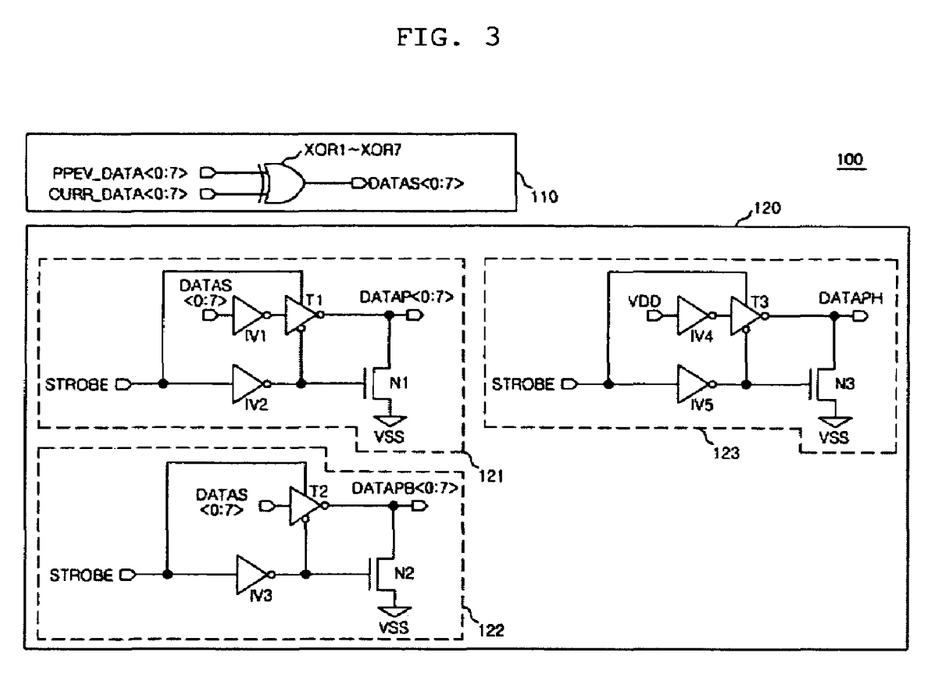
FIG. 3 is a circuit diagram showing the structure of a switching detection unit shown in FIG. 2.

As shown in FIG. 3, the data switching detection unit 100 includes a logical circuit unit 110 that outputs comparison signals DATAS<0:7> according to whether or not a previous bit is consistent with a current bit for every data bit, and a signal output unit 120 that generates the detection signals DATAP<0:7> and DATAPB<0:7> on the basis of the comparison signals DATAS<0:7> output from the logical circuit unit 110 according to a first control signal, that is, a data strobe signal (hereinafter, referred to as "strobe signal.")

The logical circuit unit 110 includes a plurality of XOR gates XOR0 to XOR7 equal to the number of data bits. The signal output unit 120 includes a plurality of first signal output units 121 equal to the number of data bits and which output first detection signals DATAP<0:7> in a pulsed form on the basis of the comparison signals output from the logical circuit unit 110 when the strobe signal is enabled; a plurality of second signal output units 122 equal to the number of data bits and which output second detection signals DATAPB<0:7> having a phase opposite to the first detection signals DATAP<0:7> when the strobe signal is enabled; and a third output unit 123 that outputs an auxiliary detection signal DATAPH when the strobe signal is enabled.

The first signal output unit 121 includes a first inverter IV1 that receives the comparison signals DATAS<0:7>; a first transfer element T1, an input terminal of which receives an output of the first inverter IV1 and a first control terminal of which receives the strobe signal; a second inverter IV2 that receives the first strobe signal and an output terminal of which is connected to a second control terminal of the first transfer element T; and a transistor N1, the gate of which receives an output of the second inverter IV2, the drain of which receives an output of the first transfer element T1, and the source of which is connected to a ground terminal.

Further, the second signal output unit 122 includes a second transfer element T2, an input terminal of which receives the comparison signals DATAS<0:7> and a first control terminal of which receives the strobe signal; a third inverter IV3 that receives the strobe signal and an output terminal of which is connected to a second control terminal of the second transfer element T2; and a transistor N2, the gate of which receives an output of the third inverter IV3, the drain of which receives an output of the second transfer element T2, and the source of which is connected to a ground terminal.

Further, the third signal output unit 123 includes a fourth inverter IV4 that is connected to a voltage terminal VDD; a third transfer element T3, an input terminal of which receives an output of the fourth inverter IV4 and a first control terminal of which receives the strobe signal; a fifth inverter IV5 that receives the strobe signal and an output terminal of which is connected to a second control terminal of the third transfer element T3; and a transistor N3, the gate of which receives an output of the fifth inverter IV5, the drain of which receives an output of the third transfer element T3, and the source of which is connected to the ground terminal.

Figure 4:
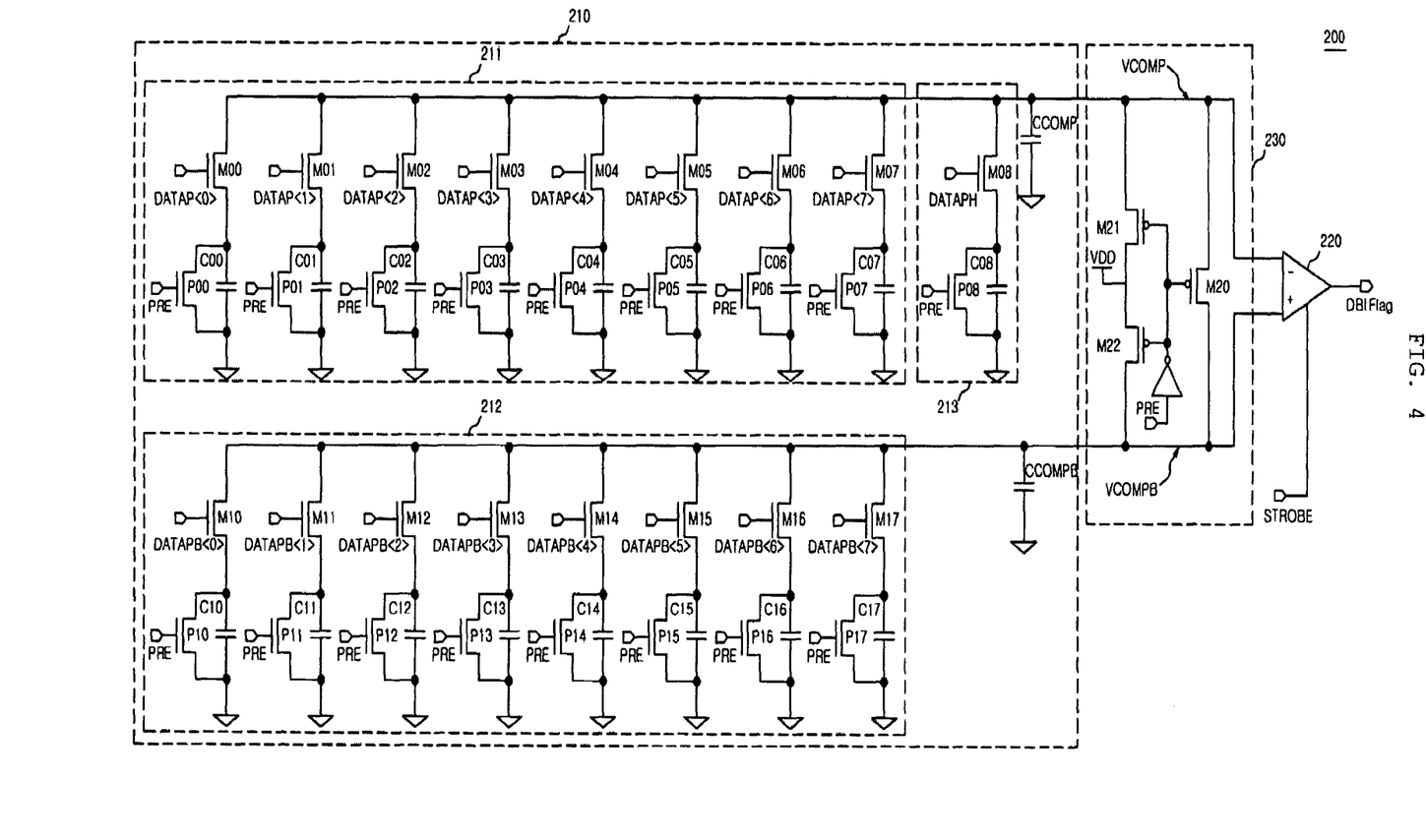
FIG. 4 is a circuit diagram showing the structure of a DBI detection unit shown in FIG. 2.

As shown in FIG. 4, the DBI detection unit 200 includes a charge sharing unit 210 that performs a charge sharing operation on the first and second detection signals DATAP<0:7> and DATAPB<0:7>, a comparator 220 that outputs the DBI signal on the basis of a level difference according to the charge sharing operation, and a precharge unit 230, that is connected between the first capacitive element CCOMP and the second capacitive element CCOMPB, which precharges the first capacitive element CCOMP and the second capacitive element CCOMPB according to a precharge signal PRE.

The charge sharing unit 210 includes a first capacitive element CCOMP, a first charge sharing unit 211 that discharges the first capacitive element CCOMP according to first detection signals DATAP<0:7>, a second capacitive element CCOMPB, a second charge sharing unit 212 that discharges the second capacitive element CCOMPB according to second detection signals DATAPB<0:7>, and a third charge sharing unit 213 that performs an additional charge sharing operation in order to prevent a charge amount of the first capacitive element CCOMP from being consistent with a charge amount of the second capacitive element CCOMPB after the charge sharing operation.

The first charge sharing unit 211 includes a plurality of transistors M00 to M07, the gates of which receive one of the first detection signals DATAP<0:7>, and either the drains or sources of which are connected to a ground terminal through individual capacitors C00 to C07 and the other is connected commonly to the first capacitive element CCOMP, and a plurality of transistors P00 to P07, the sources and drains of which are connected to both ends of the individual capacitors C00 to C07, and the gates of which receive a second control signal, that is, the precharge signal PRE.

The second charge sharing unit 212 includes a plurality of transistors M10 to M17, the gates of which receive one of the second detection signals DATAPB<0:7>, and either the drains or sources of which are connected to a ground terminal through individual capacitors C10 to C17 and the other is connected commonly to the second capacitive element CCOMPB, and a plurality of transistors P10 to P17, the sources and drains of which are connected to both ends of the individual capacitors C10 to C17 and the gates of which receive the precharge signal PRE.

The third charge sharing unit 213 includes a transistor M08, the gate of which receives the auxiliary detection signal DATAPH, and either the drain or source of which is connected to a ground terminal through a capacitor C08 and the other is connected to the first capacitive element CCOMP, and a transistor P08, the source and drain of which are connected to both ends of the capacitor C08, and the gate of which receives the precharge signal PRE.

All the transistors M00 to M08 and M10 to M17 have the same size and on-resistance value. Further, all the capacitors C00 to C08 and C10 to C17 have the same charging capacity.

Figure 5:
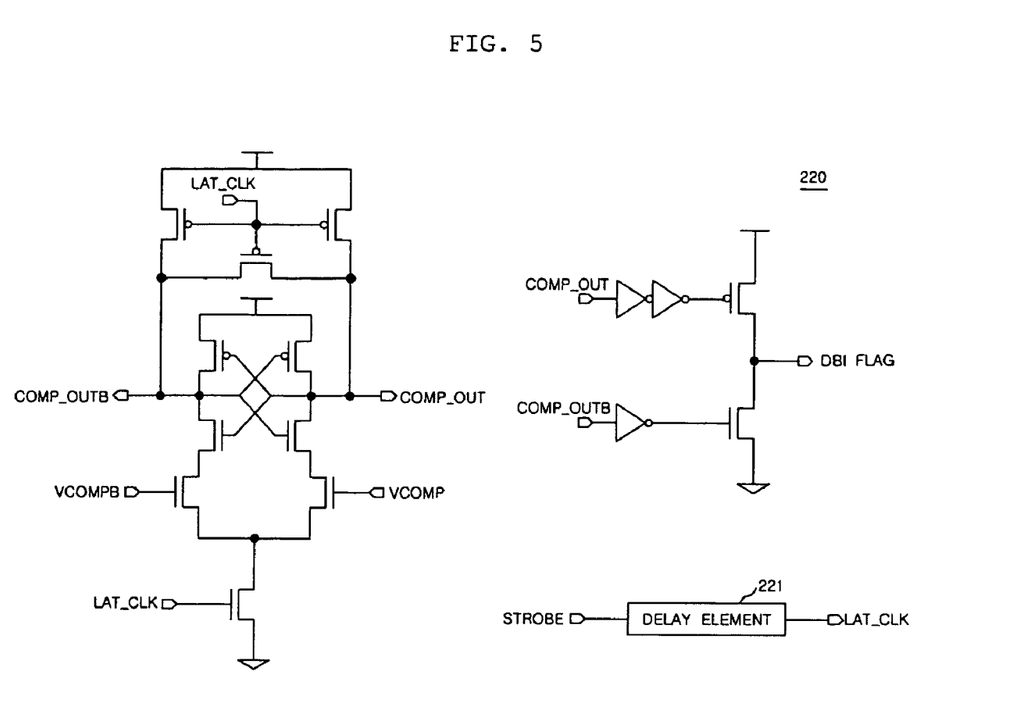
FIG. 5 is a circuit diagram showing the structure of a comparator shown in FIG. 4.

As shown in FIG. 5, the comparator 220 includes a differential amplifier that receives and compares a level value of the first capacitive element CCOMP and a level value of the second capacitive element CCOMPB, and outputs the DBI signal on the basis of the comparison result in response to a predetermined clock signal LAT_CLK. At this time, the clock signal LAT_CLK is generated by delaying the strobe signal through a delay element 221.

The precharge unit 230 includes a first transistor M20 that is connected between the first capacitive element CCOMP and the second capacitive element CCOMPB and the gate of which receives the precharge signal PRE; a second transistor M21, the gate of which receives the precharge signal PRE, the source of which is connected to the first capacitive element CCOMOP, and the drain of which is applied with power VDD; and a third transistor M22, the gate of which receives the precharge signal PRE, the source of which is applied with the power VDD, and the drain of which is connected to the second capacitive element CCOMPB.

The operation according to the exemplary embodiment of the present invention having the above-described structure will be described with reference to FIGS. 2 to 6.

First, the data switching detection unit 100 shown in FIG. 2 does not operate during precharge on the basis of the precharge signal PRE and operates in association with the strobe signal for data output.

The logical circuit unit 110 shown in FIG. 3 compares the previous data PREV_DATA<0:7> and the current data CURR_DATA<0:7> by bits. When the values are the same, the logical circuit unit 110 outputs one of the comparison signals DATAS<0:7> such that a signal corresponding to the same bit becomes low level. When the value is changed, a signal corresponding to the changed bit becomes high level.

The signal output unit 120 shown in FIG. 3 outputs the first detection signals DATAP<0:7>, the second detection signals DATAPB<0:7>, and the auxiliary detection signal DATAH when the strobe signal is enabled, according to the comparison signals DATAS<0:7>.

The first detection signals DATAP<0:7> are signals that individually generate a pulse for a signal at a high level among the comparison signals DATAS<0:7> while the strobe signal is enabled. Meanwhile, the second detection signals DATAPB<0:7> are signals that have a phase opposite to the first detection signals DATAP<0:7>, and individually generate a pulse for a signal at a low level among the comparison signals DATAS<0:7> while the strobe signal is enabled. Further, the auxiliary detection signal DATAH is a signal that generates a pulse when the strobe signal is enabled, regardless of the data comparison result. When the number of pulses of the first detection signals DATAP<0:7> is the same as the number of pulses of the second detection signals DATAPB<0:7>, the auxiliary detection signal DATAH makes the number of pulses of the first detection signals DATAP<0:7> larger than the number of pulses of the second detection signals DATAPB<0:7>.

Meanwhile, in the DBI detection unit 200 shown in FIG. 4, while a semiconductor memory apparatus is precharging, the first to third transistors M20 to M22 of the precharge unit 230 are turned on according to the precharge signal PRE such that the first capacitive element CCOMP and the second capacitive element CCOMPB are charged to the level of the power voltage VDD. Further, upon the precharge, since the strobe signal is disabled, that is, the strobe signal is at low level, all the first and second detection signals DATAP<0:7> and DATAPB<0:7> are changed to the low level such that the transistors M00 to M08 and M10 to M17 are turned off. In addition, all the transistors P00 to P08 and P10 to P17 to which the precharge signal PRE at high level is input are turned on such that the capacitors C00 to C08 and C10 to C17 are discharged to a zero level.

Figure 6:
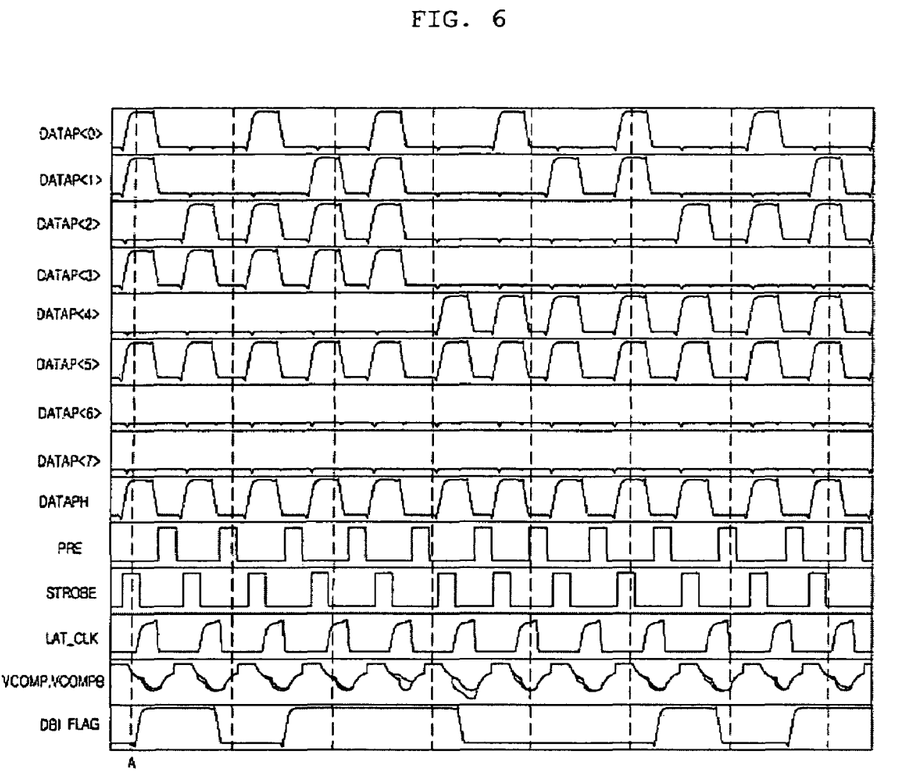
FIG. 6 is a timing chart illustrating the operation of the apparatus for generating a DBI signal in a semiconductor memory apparatus according to an exemplary embodiment of the present invention.

FIG. 6 shows an example of signal timing according to the operation of an embodiment of the present invention. FIG. 6 shows a case where pulses are generated in the first detection signals DATAP 0, 1, 3, and 5, that is, the current data CURR_DATA 0, 1, 3, and 5 are different from the previous data PREV_DATA 0, 1, 3, and 5 at a time A. The operation of an embodiment of the present invention will be described with reference to FIG. 6.

When the precharge signal PRE is input at low level and the strobe signal is at high level, the first and second charge sharing units 211 and 212 perform a charge sharing operation.

That is, the first charge sharing unit 211 turns on the transistors M00, M01, M03, and M05 and the transistor M08 of the third charge sharing unit 213 according to the first detection signals DATAP 0, 1, 3 and 5 and then discharges electric charges charged in the first capacitive element CCOMP through the five capacitors C00, C01, C03, C05, and C08 connected to the turned-on five transistors. M00, M01, M03, M05, and M08.

At the same time, the second charge sharing unit 212 turns on the transistors M12, M14, M16, and M17 according to the second detection signals DATAPB 2, 4, 6, and 7 and then discharges electric charges charged in the second capacitive element CCOMPB through the four capacitors C12, C14, C16, and C17 connected to the turned-on four transistors M12, M14, M16, and M17.

At this time, all the transistors M00 to M08 and M10 to M17 have the same size and on-resistance value. Further, all the capacitors C00 to C08 and C10 to C17 have the same charging capacity. Therefore, a discharge amount of the first capacitive element CCOMP becomes larger than a discharge amount of the second capacitive element CCOMPB, and the level of a voltage VCOMP charged in the first capacitive element CCOMP becomes lower than the level of a voltage VCOMPB charged in the second capacitive element CCOMPB.

Of course, the sizes of the transistors M00 to M08 and M10 to M17 or the charging capacities of the capacitors C00 to C08 and C10 to C17 may be different from one another due to material properties or manufacturing processes. However, since the value of the difference is very small, it has little effect on the operation according to the exemplary embodiment of the present invention.

The voltage VCOMP charged in the first capacitive element CCOMP and the voltage VCOMPB charged in the second capacitive element CCOMPB are respectively input to a negative input terminal (−) and a positive input terminal (+) of the comparator 220.

Then, as shown in FIG. 5, the comparator 220 compares the voltage VCOMP applied to the first capacitive element CCOMP and the voltage VCOMPB applied to the second capacitive element CCOMPB at a timing at which the clock signal LAT_CLK, obtained by delaying the strobe signal for a predetermined time using the delay element 221, is enabled, that is, a timing at which the clock signal LAT_CLK changes from low level to high level. Next, the comparator 220 outputs the comparison results COMP_OUT and COMP_OUTB. At this time, in order to prevent the comparator 220 from operating before the charge sharing is completed, the clock signal LAT_CLK is generated by delaying the strobe signal.

As described above, since the level of the voltage VCOMP applied to the first capacitive element CCOMP is lower than the level of the voltage VCOMPB applied to the second capacitive element CCOMPB, the comparison result value CCOMP_OUT becomes low level and the comparison result value CCOMP_OUTB becomes high level. Therefore, the DBI signal (DBI Flag) is output at high level.

That is, if the number of changed data bits is half or more, the DBI signal is output at high level, thereby reducing the number of data bits to be switched. Otherwise, the DBI signal is output at low level.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within the metes and bounds of the claims, or equivalents of such metes and bounds, are therefore intended to be embraced by the claims.

The apparatus and method of generating a DBI signal in a semiconductor memory apparatus according to the exemplary embodiment of the present invention have the following effects.

First, since output terminals of elements used for detecting data switching are not connected to the same node, a short circuit current is not generated. Therefore, it is possible to minimize current consumption.

Second, since there is no effect due to resistance skew of a transistor, an error in DBI signal generation and an error in data transfer accordingly can be prevented. Therefore, it is possible to improve the reliability of a system to which a semiconductor memory apparatus is applied.

What is claimed is:

1. An apparatus for generating a DBI (data bus inversion) signal in a semiconductor memory apparatus, comprising:
   a data switching detection unit configured to detect whether or not previous data is consistent with current data and to output a first detection signal and a second detection signal having a phase opposite to the first detection signal according to a detection result; and
   a DBI detection unit having a charge sharing unit configured to perform a charge-sharing operation using the first and second detection signals individually, according to a state where the current signal is consistent with the previous data and a state where the current signal is inconsistent with the previous data configured to output a DBI signal according to a level difference according to the charge sharing operation.

2. The apparatus of claim 1,
   wherein the data switching detection unit includes:
   a logical circuit unit configured to output a comparison signal according to whether a previous bit and a current bit are consistent with each other for every data bit of the previous and current data; and
   a signal output unit that configured to generate the first and second detection signals according to a first control signal using the comparison signal.

3. The apparatus of claim 2,
   wherein the signal output unit includes:
   a first signal output unit configured to output the first detection signal in a pulsed form based on the comparison signal when the first control signal is enabled; and
   a second signal output unit configured to output the second detection signal when the first control signal is enabled.

4. The apparatus of claim 2,
   wherein the first control signal is a data strobe signal.

5. The apparatus of claim 2,
   wherein the DBI detection unit includes:
   a charge sharing unit configured to perform a charge-sharing operation using the first and second detection signals individually, according to a state where the current signal is consistent with the previous data and a state where the current signal is inconsistent with the previous data; and
   a comparison unit configured to output the DBI signal based on a level difference according to the charge sharing operation.

6. The apparatus of claim 5,
   wherein the charge sharing unit includes:
   a first capacitive element;
   a first charge sharing unit configured to discharge the first capacitive element based on the first detection signal;
   a second capacitive element; and
   a second charge sharing unit configured to discharge the second capacitive element on the basis of the second detection signal.

7. The apparatus of claim 6,
   wherein the first charge sharing unit includes a plurality of transistors having respective gates to receive the first detection signals, and having respective drains and sources, either one of which is connected to a ground terminal through individual capacitors and the other is connected commonly to the first capacitive element.

8. The apparatus of claim 7,
   wherein the first charge sharing unit further includes a plurality of transistors having respective sources and drains connected to respective ends of the corresponding individual capacitors and having respective gates to receive a second control signal.

9. The apparatus of claim 6,
   wherein the second charge sharing unit includes a plurality of transistors having respective gates to receive the second detection signals, and having respective drains or sources, either one of which is connected to a ground terminal through respective individual capacitors and the other is connected commonly to the second capacitive element.

10. The apparatus of claim 6,
    wherein the second charge sharing unit includes:
    a plurality of transistors having respective gates to receive the second detection signals, and having respective drains and sources, either one of which is connected to a ground terminal through respective individual capacitors and the other is connected commonly to the first capacitive element; and
    a plurality of transistors having respective sources and drains connected to respective ends of the corresponding individual capacitors and having respective gates to receive a second control signal.

11. The apparatus of claim 6,
    wherein the charge sharing unit further includes a third charge sharing unit configured to perform an additional charge sharing operation according to an auxiliary detection signal in order to prevent a charge amount of the first capacitive element from being consistent with a charge amount of the second capacitive element after the charge sharing operation.

12. The apparatus of claim 11,
    wherein the third charge sharing unit includes a transistor having a gate to receive the auxiliary detection signal, and having a drain and a source, either one of which is connected to a ground terminal through a capacitor, and the other is connected to the first capacitive element.

13. The apparatus of claim 6,
    wherein the charge sharing unit further includes a transistor having a source and a drain connected to respective ends of a capacitor and having a gate to receive a second control signal.

14. The apparatus of claim 6,
    wherein the comparison unit includes a differential amplifier configured to receive and compare a level value of the first capacitive element and a level value of the second capacitive element, and to output the DBI signal based on the comparison in response to a clock signal.

15. The apparatus of claim 14,
    wherein the comparison unit further includes a delay element that delays a data strobe signal so as to generate the clock signal.

16. The apparatus of claim 6, wherein the DBI detection unit further includes a precharge unit connected between the first capacitive element and the second capacitive element and configured to precharge the first capacitive element and the second capacitive element according to a precharge signal.

17. The apparatus of claim 16,
wherein the precharge unit includes:
a first transistor connected between the first capacitive element and the second capacitive element and having a gate to receive the precharge signal;
a second transistor having a gate to receive the precharge signal, a source connected to the first capacitive element, and a drain to receive power; and
a third transistor having a gate to receive the precharge signal, a source to receive power, and a drain connected to the second capacitive element.

18. The apparatus of claim 2,
wherein the logical circuit unit includes a plurality of XOR gates configured to receive the previous bits and current bits.

19. The apparatus of claim 3,
wherein the first control signal is a data strobe signal.

20. The apparatus of claim 3,
wherein the first signal output unit includes:
a first inverter configured to receive the comparison signal and to produce an output;
a transfer element having an input terminal to receive the output of the first inverter, a first control terminal to receive the first control signal, a second control terminal, and an output;
a second inverter configured to receive the first control signal and having an output terminal connected to the second control terminal of the transfer element; and
a transistor having a gate connected to the output terminal of the second inverter, a drain to receive the output of the transfer element, and a source connected to a ground terminal.

21. The apparatus of claim 3,
wherein the second signal output unit includes:
a transfer element having an input terminal to receive the comparison signal, a first control terminal to receive the first control signal, a second control terminal, and an output;
an inverter configured to receive the first control signal, and having an output terminal connected to the second control terminal of the transfer element; and
a transistor having a gate connected to the output terminal of the inverter, a drain connected to the output of the transfer element, and a source connected to a ground terminal.

22. The apparatus of claim 3,
wherein the signal output unit further includes a third signal output unit configured to output an auxiliary detection signal when the first control signal is enabled.

23. The apparatus of claim 22,
wherein the third signal output unit includes:
a first inverter having an input terminal connected to a power terminal and an output;
a transfer element having an input terminal configured to receive the output of the first inverter, a first control terminal configured to receive the first control signal, a second control terminal, and an output;
a second inverter configured to receive the first control signal, and having an output terminal connected to the second control terminal of the transfer element; and
a transistor having a gate connected to the output terminal of the second inverter, a drain to receive an output of the transfer element, and a source connected to a ground terminal.

24. An apparatus for generating a DBI (data bus inversion) signal in a semiconductor memory apparatus comprising:
a data switching detection unit configured to output a first detection signal when previous data is consistent with current data and to output a second detection signal having a phase opposite to the first detection signal when the previous data is inconsistent with the current data;
a first capacitive element configured to discharge electric charges when the first detection signal is enabled;
a first charge sharing unit configured to discharge the first capacitive element;
a second capacitive element configured to discharge electric charges when the second detection signal is enabled;
a second charge sharing unit configured to discharge the second capacitive element; and
a comparison unit configured to compare a voltage level of the first capacitive element and a voltage level of the second capacitive element and to output a result signal on the basis of the comparison.

25. The apparatus of claim 24,
wherein the data switching detection unit includes:
a logical circuit unit configured to output a comparison signal according to whether or not a previous bit and a current bit are consistent with each other for every data bit of the previous and current data; and
a signal output unit configured to generate the first and second detection signals according to a first control signal using the comparison signal output from the logical circuit.

26. The apparatus of claim 25,
wherein the logical circuit unit includes a plurality of XOR gates configured to receive the previous bits and current bits.

27. The apparatus of claim 25,
wherein the signal output unit includes:
a first signal output unit configured to output the first detection signal in a pulsed form on the basis of the comparison signal output from the logical circuit when the first control signal is enabled; and
a second signal output unit configured to output the second detection signal having a phase opposite to the first detection signal when the first control signal is enabled.

28. The apparatus of claim 27,
wherein the first signal output unit includes:
a first inverter configured to receive the comparison signal and having an output;
a transfer element having an input terminal configured to receive the output of the first inverter, a first control terminal to receive the first control signal, a second control terminal, and an output;
a second inverter configured to receive the first control signal, and having an output terminal connected to the second control terminal of the transfer element; and
a transistor having a gate connected to the output terminal of the second inverter, a drain to receive the output of the transfer element, and a source connected to a ground terminal.

29. The apparatus of claim 27,
wherein the second signal output unit includes:
a transfer element having an input terminal configured to receive the comparison signal, a first control terminal configured to receive the first control signal, a second control terminal and an output;
an inverter configured to receive the first control signal, and having an output terminal connected to the second control terminal of the transfer element; and
a transistor having a gate connected to the output terminal of the inverter, a drain to receive the output of the transfer element, and a source connected to a ground terminal.

30. The apparatus of claim 27,
wherein the signal output unit further includes a third signal output unit configured to output an auxiliary detection signal when the first control signal is enabled.

31. The apparatus of claim 30,
wherein the third signal output unit includes:
a first inverter having an input terminal connected to a power terminal and an output;
a transfer element having an input terminal configured to receive the output of the first inverter, a first control terminal to receive the first control signal, a second control terminal and an output;
a second inverter configured to receive the first control signal and having an output terminal connected to the second control terminal of the transfer element; and
a transistor having a gate connected to the output terminal of the second inverter, a drain to receive the output of the transfer element, and a source connected to a ground terminal.

32. The apparatus of claim 24,
wherein the first charge sharing unit includes a plurality of transistors having respective gates to receive the first detection signals, and having respective drains and sources, either one of which is connected to a ground terminal through respective individual capacitors and the other is connected commonly to the first capacitive element.

33. The apparatus of claim 32,
wherein the first charge sharing unit further includes a plurality of transistors having respective sources and drains connected to respective ends of the respective individual capacitors, and having respective gates to receive a second control signal.

34. The apparatus of claim 24,
wherein the second charge sharing unit includes a plurality of transistors having respective gates to receive the second detection signals, and having respective drains and sources, either one of which is connected to a ground terminal through individual capacitors and the other is connected commonly to the second capacitive element.

35. The apparatus of claim 24,
wherein the second charge sharing unit includes:
a plurality of transistors having respective gates to receive the second detection signals, and having respective drains and sources, either one of is connected to a ground terminal through respective individual capacitors and the other is connected commonly to the second capacitive element; and
a plurality of transistors having respective sources and drains connected to respective ends of the respective individual capacitors and having respective gates to receive a control signal.

36. The apparatus of claim 24,
wherein the apparatus further includes a third charge sharing unit configured to perform an additional charge sharing operation according to an auxiliary detection signal in order to prevent a charge amount of the first capacitive element from being consistent with a charge amount of the second capacitive element after the first capacitive element and second capacitive element are discharged.

37. The apparatus of claim 36,
wherein the third charge sharing unit includes a transistor having a gate to receive the auxiliary detection signal, and having a drain and a source either of which is connected to a ground terminal through a capacitor and the other is connected to the first capacitive element.

38. The apparatus of claim 24,
wherein the charge sharing unit further includes a transistor having a source and a drain connected to both respective of the capacitor and a gate to receive the second control signal.

39. The apparatus of claim 24,
wherein the comparison unit includes a differential amplifier configured to receive and compare a level value of the first capacitive element and a level value of the second capacitive element, and to output the result signal according to the comparison in response to a clock signal.

40. The apparatus of claim 39,
wherein the comparison unit further includes a delay element configured to delay a data strobe signal so as to generate the clock signal.

41. The apparatus of claim 24,
wherein the apparatus further includes a precharge unit connected between the first capacitive element and the second capacitive element, and configured to precharge the first capacitive element and the second capacitive element according to a precharge signal.

42. The apparatus of claim 41,
wherein the precharge unit includes:
a first transistor connected between the first capacitive element and the second capacitive element and having a gate to receive the precharge signal;
a second transistor having a gate to receive the precharge signal, a source connected to the first capacitive element, and a drain to receive power; and
a third transistor having a gate to receive the precharge signal, a source to receive power, and a drain connected to the second capacitive element.

43. A method of generating a DBI (data bus inversion) signal in a semiconductor memory apparatus having first and second capacitive elements, the method comprising:
charging the first and second capacitive elements to the same level according to a control signal;
comparing previous data and current data and generating a first detection signal and a second detection signal having a phase opposite to the first detection signal according to a comparison result;
discharging the first and second capacitive elements according to the first and second detection signals; and
generating a DBI signal according to a level difference between the first and second capacitive elements.

44. The method of claim 43,
wherein the same level is an external power level.

45. The method of claim 43,
wherein the control signal is a precharge signal.

46. The method of claim 43,
wherein the comparing of the previous data and current data and the generating of first and second the detection signals according to the comparison result includes:
comparing the previous data and the current data by bits;
generating the first detection signal as the comparison result when the previous data is consistent with the current data; and
generating the second detection signal as the comparison result when the previous data is inconsistent with the current data.

47. The method of claim 43,
wherein the generating of the first and second detection signals is performed when a data strobe signal is enabled.

48. The method of claim 43,
wherein the first and second detection signals is a pulse signal.

* * * * *